United States Patent
Dikken et al.

(10) Patent No.: US 7,183,756 B1
(45) Date of Patent: Feb. 27, 2007

(54) CURRENT MONITORING SYSTEM USING BI-DIRECTIONAL CURRENT SENSOR

(75) Inventors: Jan Dikken, Nijmegen (NL); Ferry Nieuwhoff, Nijmegen (NL)

(73) Assignee: NXP BV, Eindhoven (NL)

(*) Notice: Subject to any disclaimer, the term of this patent is extended or adjusted under 35 U.S.C. 154(b) by 0 days.

(21) Appl. No.: 10/545,186

(22) PCT Filed: Feb. 6, 2004

(86) PCT No.: PCT/IB2004/050083

§ 371 (c)(1),
(2), (4) Date: Aug. 9, 2005

(87) PCT Pub. No.: WO2004/072663

PCT Pub. Date: Aug. 26, 2004

(30) Foreign Application Priority Data

Feb. 12, 2003 (EP) ................... 03100300

(51) Int. Cl.
*G05F 1/40* (2006.01)
(52) U.S. Cl. ...................... 323/280; 323/281
(58) Field of Classification Search .............. 323/273, 323/274, 280, 281
See application file for complete search history.

(56) References Cited

U.S. PATENT DOCUMENTS 5,684,390 A * 11/1997 Orchard-Webb ............ 323/281
6,215,338 B1 4/2001 Gervasi et al.

* cited by examiner

Primary Examiner—Shawn Riley
(74) Attorney, Agent, or Firm—Kevin H. Fortin

(57) ABSTRACT

A power management system (100) comprising a power generator (1) for providing a supply signal (Vchg) to a load (2), a floating controllable bi-directional current sensor (N1) coupled via a first connection (10) to the power generator and via a second connection (20) to the load (2) for detecting a positive current (pos) flowing from the power generator (1) to the load (2) and a negative current (neg) from the load (2) to the power generator (3). In accordance with the invention, the floating controllable bi-directional current sensor (N1) is controlled by a current management block (3) coupled to a control terminal (G) of the floating controllable bi-directional current sensor (N1) and to the first and second connections (10, 20) for controlling an equivalent voltage between the first connection (10) and the second connection (20), for providing a first current (Ipos), which is proportional with the positive current (pos), and for providing a second current (Ineg), which is proportional with the negative current (neg).

8 Claims, 3 Drawing Sheets

CURRENT MONITORING SYSTEM USING BI-DIRECTIONAL CURRENT SENSOR

FIELD OF THE INVENTION

The invention relates to a power management system comprising: a power generator, providing a supply signal to a load, for a floating controllable bi-directional current sensor coupled via a first connection to the power generator and via a second connection to the load for detecting a positive current flowing from the power generator to the load and a negative current from the load to the power generator.

BACKGROUND OF THE INVENTION

Power management systems are widely used in modern technology for different purposes as supervising the power consumption in an electrical system, preventing overloading, etc. At the load side there can be a battery for example. So when there is a charger, the battery will be considered the load, but when there is no charger and the battery has to supply some kind of accessory, then the battery is the power generator. So it depends on the application and the situation on what side is the power generator and on what side is the load.

U.S. Pat. No. 6,215,338 describes a monitoring of low currents through a DMOS driver i.e. a monitoring system of an output stage of a power amplifier. A feedback circuit is responsive to a voltage applied to a gate of the DMOS power transistor to limit the minimum value to which the drain-source voltage may drop to keep it sufficiently high, and to allow a reliable monitoring of the current through the power transistor, even at relatively low levels. This is performed by increasing the conduction resistance of the power transistor at low current levels. It is observed that the source of the DMOS transistor is connected to a reference terminal i.e. it is grounded. Furthermore, there is no indication on an inverse current through the transistor. It should be pointed out that in applications, as battery charging, it is desirable to monitor a floating current i.e. not related to a reference terminal as ground, the current circulating either from a source to a load or vice versa. The solution provided by the prior art could, therefore, not be applied mutatis mutandis to a power management system for a floating current.

SUMMARY OF THE INVENTION

It is therefore an object of this invention to provide a cheap solution to the above-mentioned problem.

In accordance with the invention this is achieved in a system described in the first paragraph characterized in that the floating controllable bi-directional current sensor is controlled by a current management block coupled to a control terminal of the floating controllable bi-directional current sensor for controlling an equivalent resistance between the first connection 10 and the second connection 20, for providing a first current, which is proportional with the positive current, and for providing a second current, which is proportional with the negative current. The floating controllable bi-directional current sensor may be a MOS transistor whose drain-source resistance (Rds) is controlled by a gate-source voltage. The current management block controls the gate voltage in such a way that the Rds of the MOS transistor is increased at low drain-source currents. By having a higher Rds at low currents, more voltage drop across the floating controllable bi-directional current sensor is created, which makes the current direction detection by e.g. a comparator much easier. FIG. 3 depicts the difference between the original transfer and the new transfer characteristic of the floating controllable bi-directional current sensor. At lower currents the current management block starts to become active and controls the controlled terminal of the floating controllable bi-directional current sensor in such a way that a voltage between the second connection and the first connection is at least equal to Vreg.

In this way it is possible to increase the Rds of the floating controllable bi-directional current sensor. At higher currents the current management block cannot make the voltage between the second connection and the first connection substantially equal to Vreg, so the Rds equals the Rdson of the floating controllable bi-directional current sensor. Rdson equals the resistance of the MOS transistor when it is fully switched on. This is true when: Ids>Vregdson or Ids<−Vreg/Rdson. When the voltage between the second connection and the first connection is around zero, the control terminal of floating controllable bi-directional current sensor is clamped in such away that the Rds has a constant value, substantially larger, for example $Rds_{(clamped)}=40\Omega$, than Rdson, which is typically fractions of ohm. The range where the floating controllable bi-directional current sensor has a constant Rds is from $[-Ids=Vreg/Rds_{(clamped)}]$ or $[+Ids=Vreg/Rds_{(clamped)}]$. Hence, three different operating ranges may be distinguished, as shown in Table 1.

TABLE 1

| Range | Resistance Rds |
|---|---|
| Currents around zero | Rds is almost constant but much higher than the Rdson (e.g. 40Ω) |
| Low currents | Rds is regulated and not constant |
| High currents | Rds = Rdson (e.g. Rdson = 0.3Ω) |

The current management block generates a first current, which is proportional with the positive current and a second current, which is proportional with the negative current. These currents may be further used as indicating the state of the system.

In an embodiment of the invention, the system further comprises a differential comparator for comparing a signal proportional with the first current and a reference signal, to generate a first feedback signal to a charge controller whenever the positive current is larger than a predetermined value. This facility is necessary in any power management system for preventing any damage determined by an increased power demand of the load. The controller determines an interruption of the connection between the power generator and load e.g. providing a signal OFF to the current management block. This facility is useful e.g. when the battery is already charged too much.

In another embodiment of the invention, the power management system further comprises a differential comparator coupled to the first connection and to the second connection and providing an inverse current signal to a charge controller for preventing flowing inverse currents from the load to the power generator or to prevent charge current from power generator to load, depending on the state of the system.

When the battery is overcharged it is desirable to prevent charge current and when it is overdischarged it is desirable to prevent reverse or discharge currents.

This facility is useful e.g. when the battery is already discharged too much. It should be observed that the above-mentioned inverse currents may have relatively low values and therefore a relatively large value of Rds between the first connection and second connection makes possible detection of relatively low inverse currents.

In an embodiment of the invention, the current management block comprises a first sense detector coupled between the first connection and a non-inverting input of a first differential amplifier. A current through a first current generator coupled to an output of the first differential amplifier is proportional with the positive current.

The current management block further comprises a second sense detector coupled between the second connection and a non-inverting input of a second differential amplifier. A current through a second current generator coupled to an output of the second differential amplifier is proportional with the negative current. The current management block further comprises a clamping circuit for clamping the floating controllable bi-directional current sensor when either the positive current or the negative current have a relatively low value. The current management block comprises a regulator coupled to the clamping circuit for regulating the positive currents and negative currents of the floating controllable bi-directional current sensor. The sense detectors may be e.g. MOS transistors having a substantially lower area than the MOS transistor used as floating controllable bi-directional current sensor for minimizing a power consummated by the sense detectors. Differential amplifiers provide a substantially same potential for the sources of the transistors i.e. a common floating potential. The amplifiers control respective current sources, which provide currents that are proportional either with the positive current or the negative current, the regulator regulating the on-resistance Rds of the floating controllable bi-directional current sensor at low currents, keeping Rds at an almost constant high value for currents around zero.

BRIEF DESCRIPTION OF THE DRAWINGS

The above and other features and advantages of the invention will be apparent from the following description of the exemplary embodiments of the invention with reference to the accompanying drawings, in which.

DETAILED DESCRIPTION OF THE INVENTION

Figure 1:
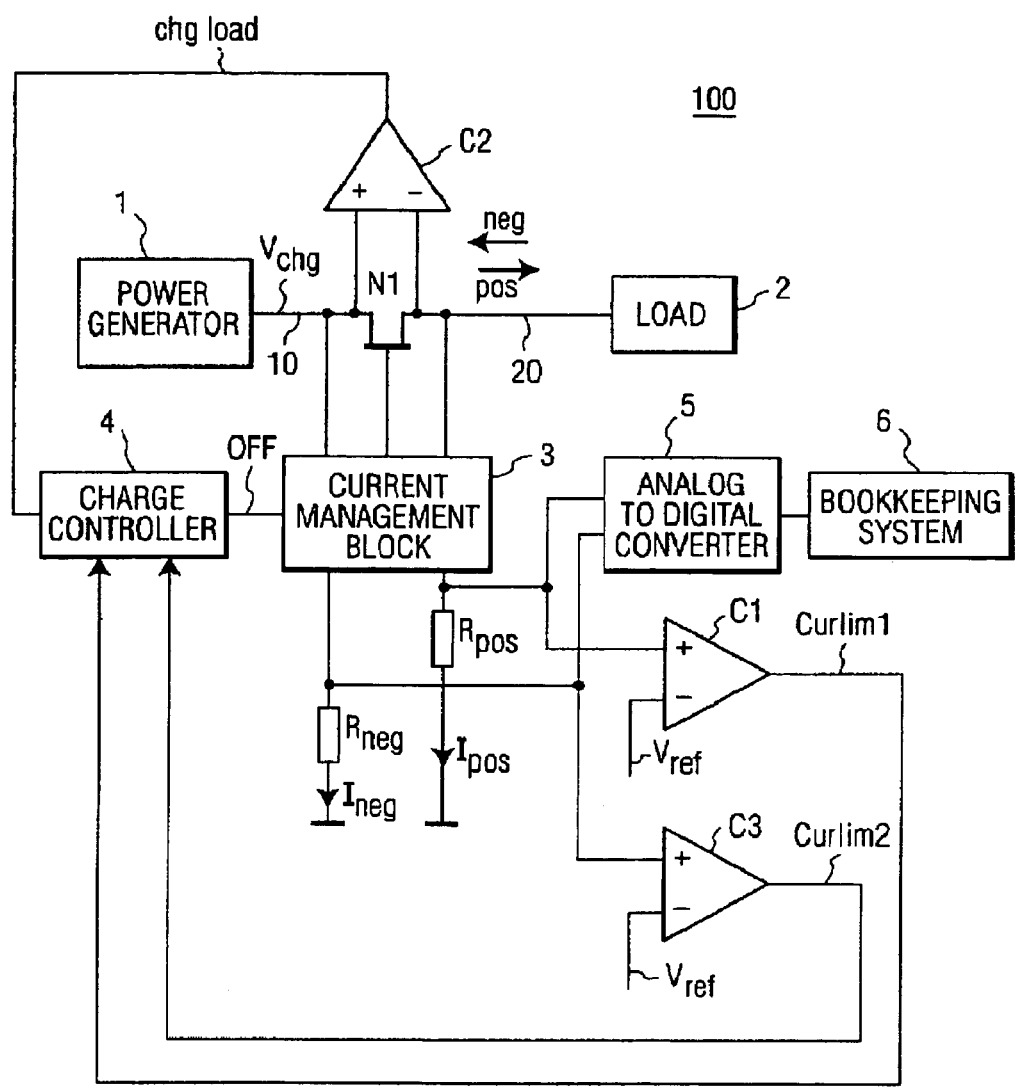
FIG. 1 depicts a block diagram of a power management system according to the invention.

FIG. 1 depicts a block diagram of a power management system, according to the invention. The power management system 100 comprises a power generator 1, which provides supply signal Vchg to a load 2. The system further comprises a floating controllable bi-directional current sensor N1 shown as a MOS transistor. The transistor N1 is coupled via a first connection 10 to the power generator 1 and via a second connection 20 to the load 2. The transistor N1 detects a positive current pos flowing from the power generator 1 to the load 2 and a negative current neg from the load 2 to the power generator 1. The MOS transistor N1 is controlled by a current management block 3 coupled to a control terminal e.g. gate G of the MOS transistor N1 for controlling an equivalent resistance between the first connection 10 and the second connection 20.

Figure 3:
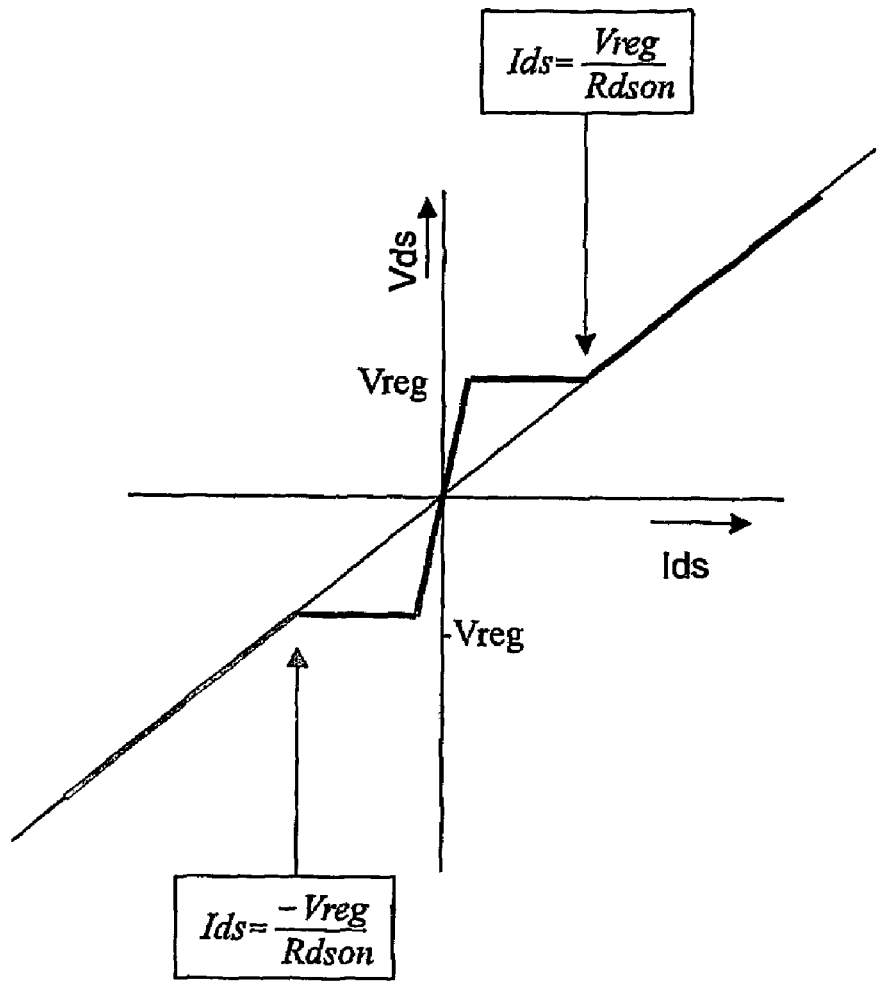
FIG. 3 depicts the plot of the VDS of a MOS transistor used as floating controllable bi-directional current sensor as function of the current.

The current management block 3 provides a first current Ipos, which is proportional with the positive current pos, and a second current Ineg, which is proportional with the negative current neg. A drain-source resistance Rds of the transistor N1 is controlled by a gate-source voltage. The current management block 3 controls the gate voltage in such a way that the Rds of the MOS transistor N1 is increased at low drain-source currents. By having a higher Rds at low currents, there is a higher voltage drop across transistor N1 i.e. its drain—source voltage increases, which makes the current direction detection by e.g. a comparator much easier. FIG. 3 depicts the difference between the original transfer and the new transfer characteristic of the transistor N1. At lower currents the current management block 3 starts to become active and controls the controlled terminal G of transistor N1 in such a way that a voltage between the second connection 20 and the first connection 10 is at least equal to Vreg. Vreg is a convenient drain-source voltage for which the drain-source resistance Rds is sufficiently high when low currents flows through transistor N1. In this way it is possible to increase the Rds of the transistor N1. Increasing the Rds is allowed because the dissipation of N1 is not much affected at low currents. At higher currents the current management block 3 cannot make the voltage between the second connection 20 and the first connection 10 substantially equal to Vreg, so the Rds equals the Rdson of the transistor N1. This is true when: Ids>Vreg/Rdson or Ids<−Vreg/Rdson. When the voltage between the second connection 20 and the first connection 10 is around zero, the control terminal G of transistor N1 is clamped in such away that the Rds has a constant value, substantially larger, for example $Rds_{(clamped)}=40\Omega$, than Rdson, which is typically fractions of ohm. The range where the floating controllable bi-directional current sensor has a constant Rds is from $[-Ids=Vreg/Rds_{(clamped)}]$ or $[+Ids=Vreg/Rds_{(clamped)}]$. Hence, three different operating areas are put into the evidence, as shown in Table 1.

The circuit may be used for a "state of charge system" which indicates how much energy is left in a battery when the load 2 is a battery. If the current Ipos increases, then the voltage drop across Rpos is increased. The same happens for negative currents Ineg, i.e. voltage drop across Rneg increases when Ineg increases. An Analog to Digital Converter (ADC) 5, which samples for example at 8 KHz, converts a difference between the voltage drops on Rpos and Rneg into a binary signal. The binary signal is inputted to a so called "bookkeeping system" 6 that calculates how much energy is left in the battery. If a positive current (the battery is charged) is measured, the value of a register in the bookkeeping system 6 is increased proportionally to the current trough transistor N1. When energy is delivered by the battery i.e. the current through the transistor is negative the opposite happens i.e. the value of the bookkeeping system 6 register is decreased proportionally to the current through transistor N1.

The system 100 further comprises a differential comparator C1 having an inverting input receiving a signal proportional with the first current Ipos and a non-inverting input receiving a reference signal Vref. The differential comparator C1 generates a first feedback signal Curlim1 to a charge controller 4 whenever the positive current pos is larger than a predetermined value. The positive current Ipos is proportional with the positive current pos flowing through transistor N1. When Ipos increases the voltage drop across Rpos also increases. The voltage across Rpos is compared with a bandgap reference voltage Vref. When this voltage exceeds the bandgap voltage the current-limit is reached and the first feedback signal Curlim1 becomes HIGH. The charge controller 4 of the system 100 takes action on this event and switches off the transistor N1 and determines a STOP of charging the battery for safety reasons. The level where the current limit is detected depends on Rpos as Ipos*Rpos and, therefore, may be modified by changing the value of the resistor Rpos. It is understood that alternatively, several current limiters instead of current protection as described above may be used. In this situation C1 is a differential amplifier driving a current generator, which controls directly the gate of N1. Hence, the current is limited and no switched off occurs.

In battery charge applications, when the battery voltage is below a certain pre-charge level, to preserve the lifetime of the battery, the battery is charged with a so-called pre-charge current, which is relatively low, typically in the order of 100 mA. In this case the regulator is used to increase the accuracy of the pre-charge current.

Furthermore, charging current limit may be adjustable by means of an external resistor, which is connected to ground. The current flowing through this resistor is the same current flowing through one of the (current) sense detectors, so the voltage across this resistor is a measure of the positive current through the floating controllable bi-directional current sensor. Thanks to the regulator there is an accurate linear relationship between these currents even with very low currents. This is the same as with Rpos above, but here we used the resistor also to adjust the current limit.

The system 100 further comprises a differential comparator C3 for comparing a signal proportional with the second current Ineg and a reference signal Vref, to generate a second feedback signal Curlim2 to the charge controller 4 whenever the negative current neg is larger than a predetermined value. The comparator C3 works similarly with comparator C1 and all the related aspects presented in previous paragraph applies mutatis mutandis to C3.

The system 100 further comprises a differential comparator C2 coupled to the first connection and to the second connection and providing an inverse current signal Chgload to the charge controller 4 for preventing inverse currents from flowing from the load 2 to the power generator 1. This solution is successfully implemented on Silicon and can be transferred to any technology. The circuit is used for safety reasons to prevent current flowing from the battery 2 to the charger i.e. the current through N1 in neg direction. When the second comparator C2 detects a current from battery 2 to the power generator 2 the second comparator C2 provides the inverse current signal Chgload to the charge controller 4, the charge controller 4 generating an OFF signal that disables the transistor N1. It is to be mentioned here that the comparators C1 and C2 may be used because the resistance Rds of the transistor N1 is increased at relatively low positive pos and negative neg currents. This feature decreases the dependence of the threshold level on the technological spread of the comparators C1 and C2. The output of comparator (C2) can also be considered as a direction indicator and can be used as such, so also for preventing current in the other direction, should this be necessary. To be sure comparator (C2) will never indicate a positive current direction in case of negative currents no matter how small, it has to be given a certain bias which is a bit larger than its offset voltage. This will leave very small positive currents undetected. So increasing $R_{clamped}$ will decrease the size of the currents that are undetected.

Figure 2:
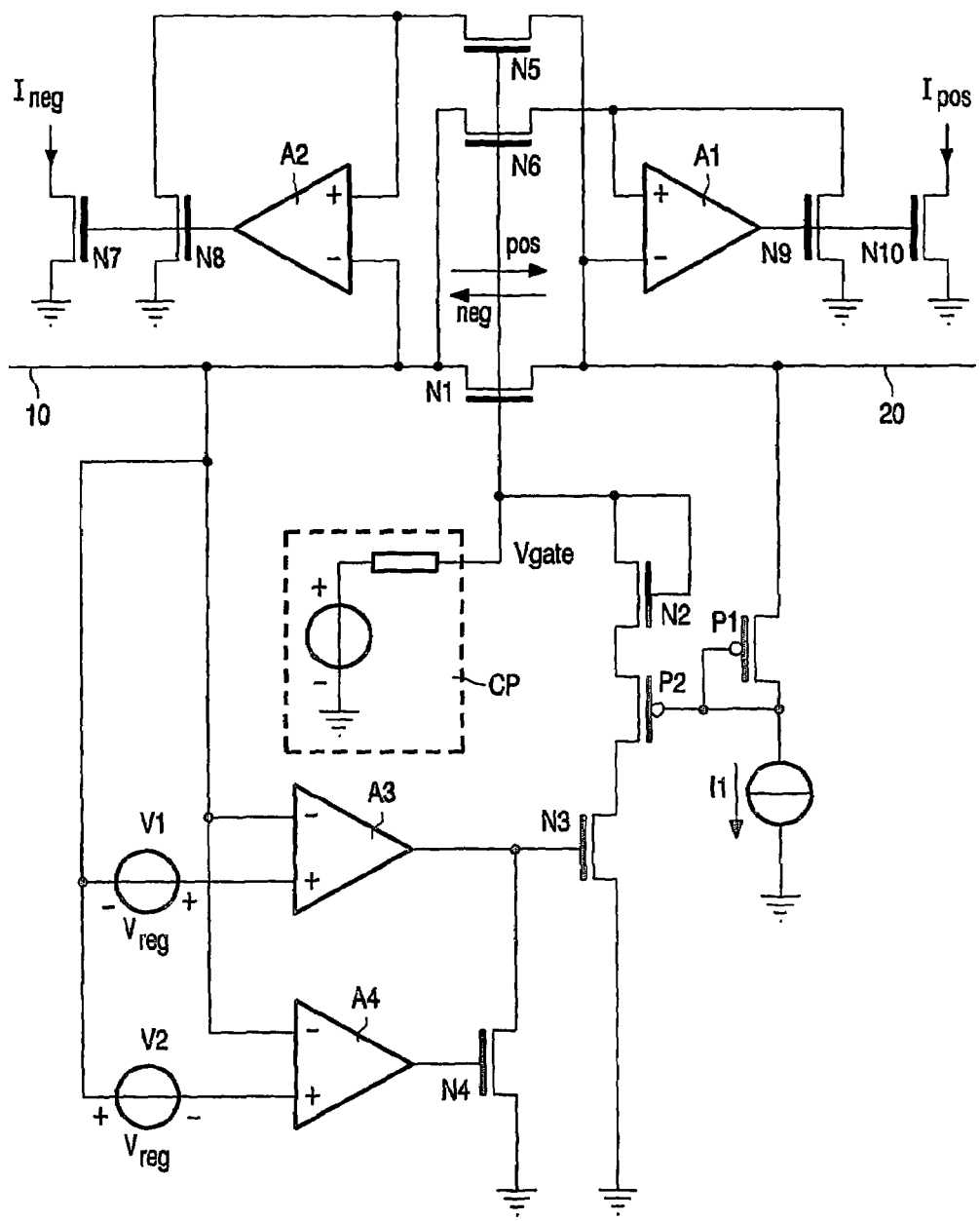
FIG. 2 depicts a current management block according to an embodiment of the invention.

FIG. 2 depicts a current management block, according to an embodiment of the invention. The current management block 3 comprises a first sense detector N6 implemented with a MOS transistor coupled between the first connection 10 and a non-inverting input of a first differential amplifier A1. A current Ipos through a first current generator N10, which is a MOS transistor coupled to an output of the first differential amplifier A1 being proportional with the positive current pos. Transistor N6 has a smaller area than the transistor N1. A current through transistor N6 is proportional with the current through N1 because they have a common gate connection, a common drain connection and their sources are connected to two different points having the same potential i.e. the inputs of the first differential amplifier A1. The current management block 3 further comprises a second sense detector N5, which is a MOS transistor having a smaller area than the transistor N1 coupled between the second connection 20 and a non-inverting input of a second differential amplifier A2. A current Ineg through a second current generator N7, which is a MOS transistor coupled to an output of the second differential amplifier A2 being proportional with the negative current neg. The above considerations may be applied mutatis mutandis to amplifier A2 and transistors N5 and N7.

The current management block 3 comprises a clamping circuit P1, P2, N2, I1 for clamping the transistor N1 when either the positive current pos or the negative current neg have a relatively low value. The current management block 3 further comprises a regulator A3, A4, V1, V2, N3, N4, CP coupled to the clamping circuit P1, P2, N2, I1 for regulating the drain-source voltage of transistor N1 equal to Vref in case of lower currents.

A third amplifier A3 is responsible for regulating the transistor N1 when a positive current pos is flowing through it A fourth amplifier A4 regulates N1 when negative currents neg flowing through N1. For currents around zero the gate G of N1 is clamped by the clamping circuit formed by transistors P1, P2, N2 and current source I1.

This topology can be implemented with other types of transistors, other polarities can also lead to this function.

It is mentioned here that resistors may be connected between the source of N8, N9 and ground. Consequently, sources of N7 and N10 are also coupled to ground via resistors.

Preferably, the third amplifier A3 has a limited current sourcing capability, which may be also implemented using a resistor coupled between the output of the third amplifier A3 and gate of transistor N3.

Furthermore, a series coupling comprising a resistor and a capacitor between gate and drain terminals of transistor N4 may improve the stability of the circuit.

It is remarked that the scope of protection of the invention is not restricted to the embodiments described herein. Neither is the scope of protection of the invention restricted by the reference numerals in the claims. The word 'comprising' does not exclude other parts than those mentioned in the claims. The word 'a(n)' preceding an element does not exclude a plurality of those elements. Means forming part of the invention may both be implemented in the form of dedicated hardware or in the form of a programmed purpose processor. The invention resides in each new feature or combination of features.

The invention claimed is:

1. A power management system (100) comprising:
a power generator (1),
providing a supply signal (Vchg) to a load (2),
for a floating controllable bi-directional current sensor (N1) coupled via a first connection (10) to the power generator and via a second connection (20) to the load (2) for detecting a positive current (pos) flowing from the power generator (1) to the load (2) and a negative current (neg) from the load (2) to the power generator (1), and a current management block (3) coupled to a control terminal (G) of the floating controllable bi-directional current sensor (N1) and to the first and second connections (10, 20) for controlling an equivalent resistance between the first connection (10) and the second connection (20), for providing a first current (Ipos), which is proportional with the positive current (pos) and, for providing a second current (Ineg), which is proportional with the negative current (neg).

2. A system (100) as claimed in claim 1, further comprising a differential comparator (C1) for comparing a signal proportional with the first current (Ipos) and a reference signal (Vref), to generate a first feedback signal (Curlim1) to a charge controller (4) whenever the positive current (pos) is larger than a predetermined value.

3. A system (100) as claimed in claim 1, further comprising a differential comparator (C3) for comparing a signal proportional with the second current (Ineg) and a reference signal (Vref), to generate a second feedback signal (Curlim2) to a charge controller (4) whenever the negative current (neg) is larger than a predetermined value.

4. A system (100) as claimed in claim 1, further comprising a comparator (C2) coupled to the first connection (10) and to the second connection (20) and providing an inverse current signal (Chgload) to a charge controller (4) for preventing flowing inverse currents from the load (2) to the power generator (1) or to prevent charge current from power generator (1) to load (2), depending on the state of the system.

5. A system as claimed in claim 1, wherein the current management block (3) comprises a first sense detector (N6) coupled between the first connection (10) and a non-inverting input of a first differential amplifier (A1), a current (Ipos) through a first current generator (N10) coupled to an output of the first differential amplifier (A1) being proportional with the positive current (pos).

6. A system as claimed in claim 4, wherein the current management block (3) further comprises a second sense detector (N5) coupled between the second connection (20) and a non-inverting input of a second differential amplifier (A2), a current (Ineg) through a second current generator (N7) coupled to an output of the second differential amplifier (A2) being proportional with the negative current (neg).

7. A system as claimed in claim 1, wherein the current management block (3) comprises a clamping circuit (P1, P2, N2, I1) for clamping the floating controllable bi-directional current sensor (N1) when either the positive current (pos) or the negative current (neg) has a relatively low value.

8. A system (100) as claimed in claim 1, wherein the current management block (3) comprises a regulator (A3, A4, V1, V2, N3, N4, CP) coupled to the clamping circuit (P1, P2, N2, I1) for regulating the drain-source voltage Vds of the floating controllable bi-directional current sensor (N1).

* * * * *